(12) United States Patent
Matsuda

(10) Patent No.: US 12,464,653 B2
(45) Date of Patent: Nov. 4, 2025

(54) CIRCUIT BOARD AND ELECTRONIC-COMPONENT-EQUIPPED CIRCUIT BOARD

(71) Applicant: Murata Manufacturing Co., Ltd., Nagaokakyo (JP)

(72) Inventor: Kenji Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 218 days.

(21) Appl. No.: 18/229,717

(22) Filed: Aug. 3, 2023

(65) Prior Publication Data

US 2023/0380075 A1 Nov. 23, 2023

Related U.S. Application Data

(63) Continuation of application No. PCT/JP2022/005045, filed on Feb. 9, 2022.

(30) Foreign Application Priority Data

Feb. 16, 2021 (JP) ................. 2021-022289

(51) Int. Cl.
*H05K 1/18* (2006.01)
*H05K 1/02* (2006.01)
(Continued)

(52) U.S. Cl.
CPC ......... *H05K 3/4644* (2013.01); *H05K 1/0242* (2013.01); *H05K 1/181* (2013.01);
(Continued)

(58) Field of Classification Search
CPC .... H05K 1/0242; H05K 1/181; H05K 1/0298; H05K 1/0219; H05K 1/118; H05K 1/189;
(Continued)

(56) References Cited

U.S. PATENT DOCUMENTS 6,195,260 B1 * 2/2001 Moriyama ............. H05K 1/189
174/254
2009/0016031 A1 1/2009 Matsumoto
(Continued)

FOREIGN PATENT DOCUMENTS

JP   2009038341 A   2/2009
JP   4292860 B2     7/2009
(Continued)

OTHER PUBLICATIONS

International Search Report in PCT/JP2022/005045, mailed May 17, 2022, 3 pages.
(Continued)

*Primary Examiner* — Roshn K Varghese
(74) *Attorney, Agent, or Firm* — Keating & Bennett, LLP

(57) ABSTRACT

A multilayer body includes insulator layers including a first insulator layer laminated in a vertical direction. Electrodes include a signal electrode and are provided at an upper main surface of the first insulator layer and arranged in a transverse direction. At least a portion of each of the electrodes is exposed to outside from a circuit board. First and second interlayer connection conductors extend through the first insulator layer in the vertical direction and electrically connect the signal electrode and a signal conductor layer. Mounting portions are located at the portions of the electrodes that are exposed to the outside from the circuit board. The first and second interlayer connection conductors are electrically connected to the signal electrode so as not to overlap the mounting portion that is provided at the signal electrode.

19 Claims, 11 Drawing Sheets

(51) Int. Cl.
H05K 3/30 (2006.01)
H05K 3/46 (2006.01)

(52) U.S. Cl.
CPC ... *H05K 3/303* (2013.01); *H05K 2201/09336* (2013.01); *H05K 2201/09354* (2013.01); *H05K 2201/10098* (2013.01); *H05K 2203/1572* (2013.01)

(58) Field of Classification Search
CPC ........ H05K 1/115; H05K 1/116; H05K 1/025; H05K 2201/09336; H05K 2201/09354; H05K 2201/10098; H05K 2201/0129
See application file for complete search history.

(56) References Cited

U.S. PATENT DOCUMENTS

| | | | |
|---|---|---|---|
| 2011/0100680 A1 | 5/2011 | Naganuma | |
| 2013/0147581 A1* | 6/2013 | Kato | H05K 1/0253 333/238 |
| 2014/0305688 A1 | 10/2014 | Matsumoto et al. | |
| 2015/0092356 A1* | 4/2015 | Yoshikawa | H05K 1/113 174/258 |
| 2016/0064793 A1* | 3/2016 | Yosui | H05K 1/147 333/238 |
| 2016/0197020 A1* | 7/2016 | Lim | H01L 24/09 257/774 |
| 2017/0149111 A1* | 5/2017 | Yosui | H05K 1/0237 |
| 2021/0168931 A1 | 6/2021 | Nagai et al. | |
| 2021/0288390 A1 | 9/2021 | Tago | |

FOREIGN PATENT DOCUMENTS

| | | |
|---|---|---|
| JP | 2014225640 A | 12/2014 |
| JP | 2017005101 A | 1/2017 |
| WO | 2011052358 A1 | 5/2011 |
| WO | 2016163436 A1 | 10/2016 |
| WO | 2020040108 A1 | 2/2020 |
| WO | 2020130010 A1 | 6/2020 |

OTHER PUBLICATIONS

Written Opinion in PCT/JP2022/005045, mailed May 17, 2022, 6 pages.

* cited by examiner

Fig.4
A—A
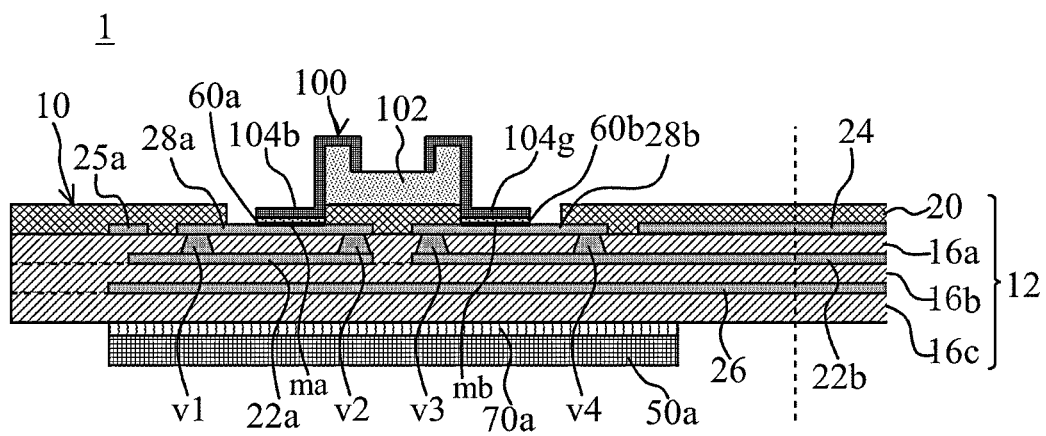
B—B
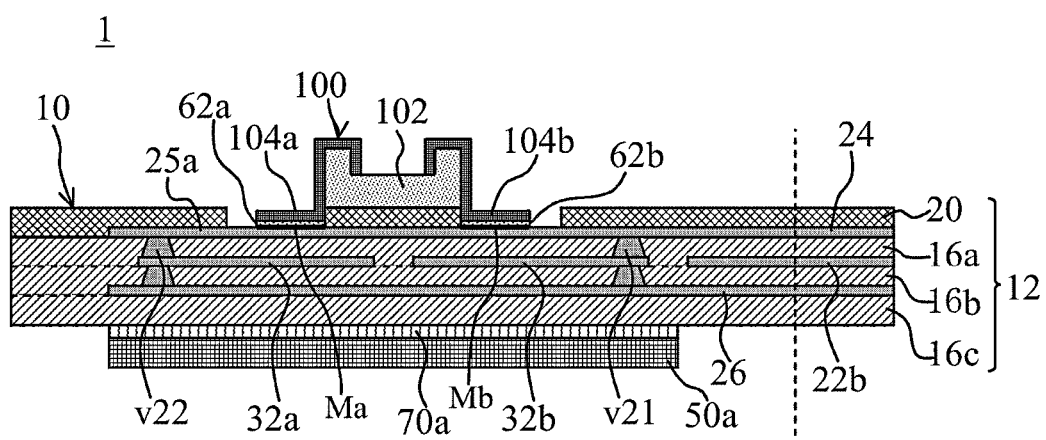
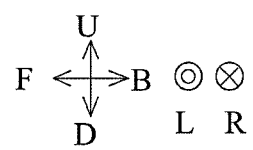

Fig.6
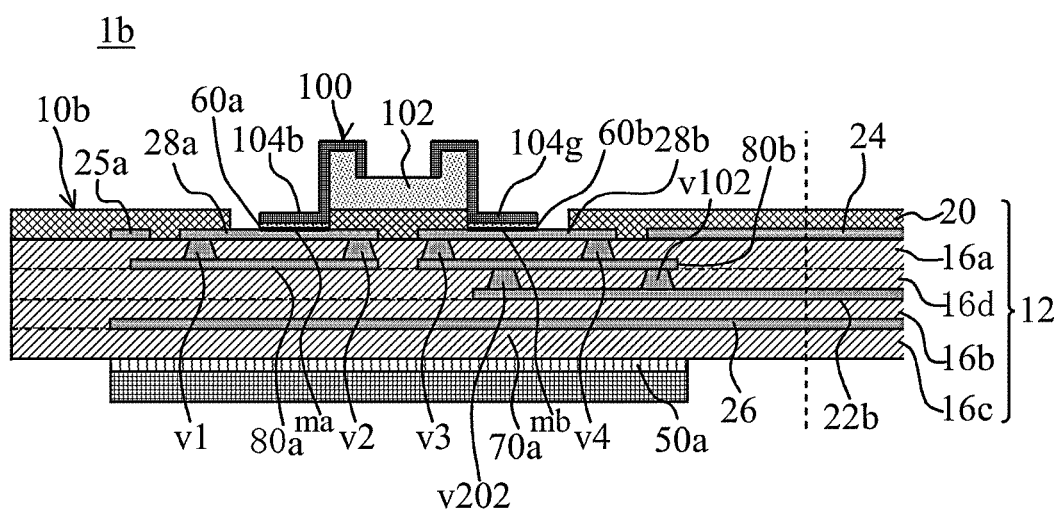
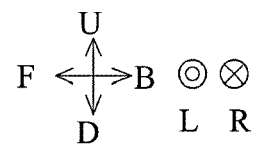

CIRCUIT BOARD AND ELECTRONIC-COMPONENT-EQUIPPED CIRCUIT BOARD

CROSS REFERENCE TO RELATED APPLICATIONS

This application claims the benefit of priority to Japanese Patent Application No. 2021-022289 filed on Feb. 16, 2021 and is a Continuation Application of PCT Application No. PCT/JP2022/005045 filed on Feb. 9, 2022. The entire contents of each application are hereby incorporated herein by reference.

BACKGROUND OF THE INVENTION

1. Field of the Invention

The present invention relates to a circuit board including a multilayer body having a structure in which a plurality of insulator layers are laminated and an electronic-component-equipped circuit board.

2. Description of the Related Art

A multilayer electronic circuit device described in Japanese Patent No. 4292860 is known as an invention that is related to a circuit board of the related art. Such a multilayer electronic circuit device includes a substrate and electronic components. The substrate includes a plurality of electrode pads. The electronic components are mounted on the plurality of electrode pads with solder.

With a reduction in the sizes of electronic components, a plurality of electrode pads have been decreasing in size. As a plurality of electrode pads become smaller, their resistances increase. As a result, a loss of the radio frequency signal transmitted through a substrate and electronic components increases.

SUMMARY OF THE INVENTION

Accordingly, preferred embodiments of the present invention provide circuit boards and electronic-component-equipped circuit boards that are each able to reduce a radio-frequency signal loss.

A circuit board according to a preferred embodiment of the present invention includes a multilayer body including a plurality of insulator layers including a first insulator layer laminated in a vertical direction, a plurality of electrodes including a signal electrode and that are provided at an upper main surface of the first insulator layer so as to be arranged in a transverse direction, at least a portion of each of the plurality of electrodes being exposed to an outside from the circuit board, a signal conductor layer provided at the multilayer body and located below the signal electrode, and a first interlayer connection conductor and a second interlayer connection conductor extending through the first insulator layer in the vertical direction and that electrically connect the signal electrode and the signal conductor layer to each other. A plurality of mounting portions are located at the portions of the plurality of electrodes that are exposed to the outside from the circuit board. The first interlayer connection conductor and the second interlayer connection conductor are electrically connected to the signal electrode so as not to overlap one of the mounting portions, the one mounting portion being provided at the signal electrode, when viewed in the vertical direction.

An electronic-component-equipped circuit board according to a preferred embodiment of the present invention includes an electronic component and a circuit board. The electronic component includes at least one terminal. The circuit board includes a multilayer body including a plurality of insulator layers including a first insulator layer laminated in a vertical direction, a signal electrode provided at an upper main surface of the first insulator layer and including a portion exposed to outside from the circuit board, a signal conductor layer provided at the multilayer body so as to be located below the signal electrode, a first interlayer connection conductor and a second interlayer connection conductor extending through the first insulator layer in the vertical direction and electrically connect the signal electrode and the signal conductor layer to each other, and a conductive bond. A mounting portion is located at the portion of the signal electrode that is exposed to the outside from the circuit board. The first interlayer connection conductor and the second interlayer connection conductor are electrically connected to the signal electrode so as not to overlap the mounting portion, which is provided at the signal electrode, when viewed in the vertical direction. The conductive bond electrically connects the at least one terminal of the electronic component and the mounting portion to each other.

According to preferred embodiments of the present invention, a radio-frequency signal loss is able to be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 includes a sectional view taken along line A-A of FIG. 3 and a sectional view taken along line B-B of FIG. 3.

FIG. 6 is a sectional view of an electronic-component-equipped circuit board 1b according to a preferred embodiment of the present invention.

DETAILED DESCRIPTION OF THE PREFERRED EMBODIMENTS

Preferred Embodiment

Structure of Circuit Board 10 and Electronic-Component-Equipped Circuit Board 1

Figure 1:
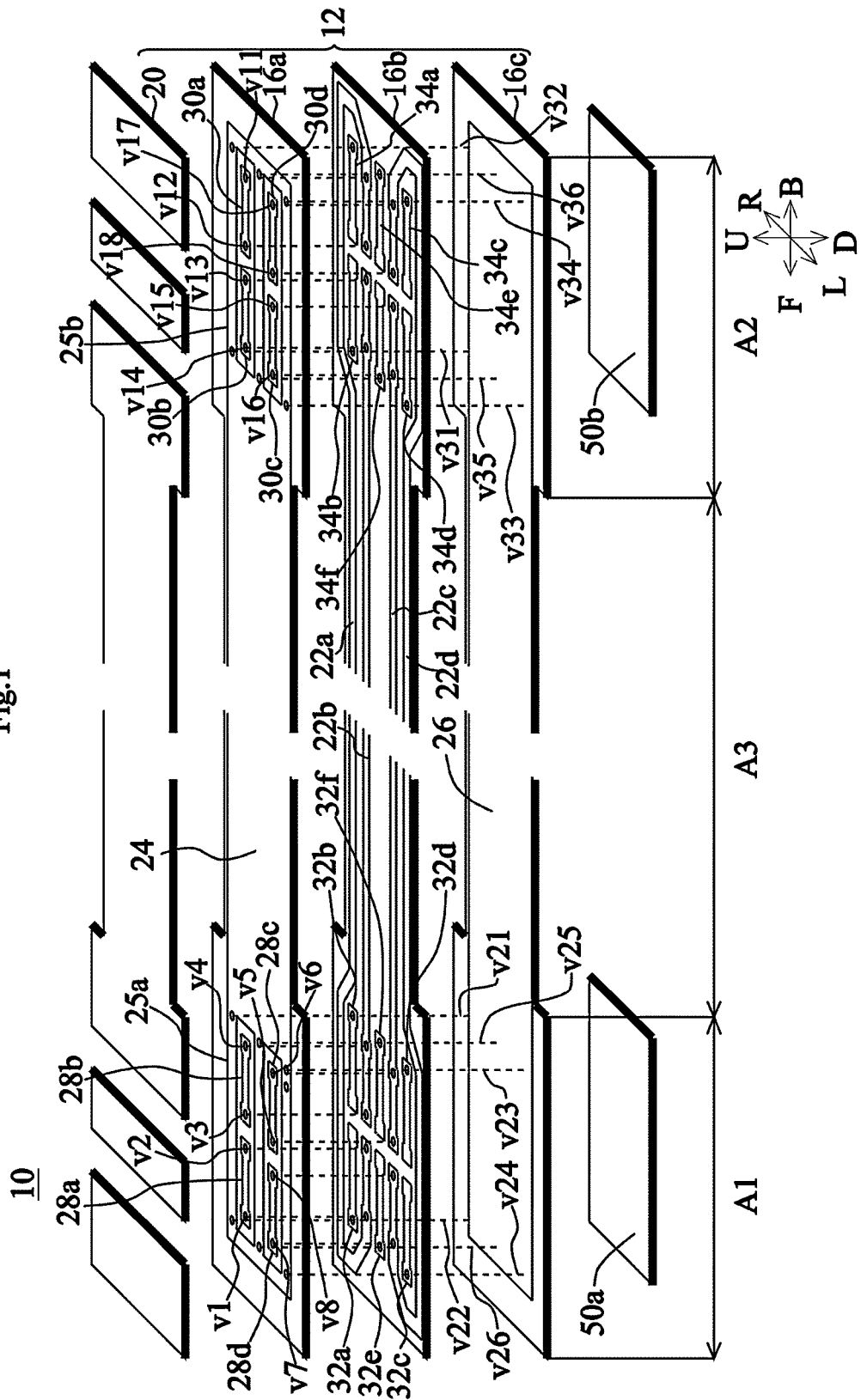
FIG. 1 is an exploded perspective view of a circuit board 10 according to a preferred embodiment of the present invention.
Figure 2:
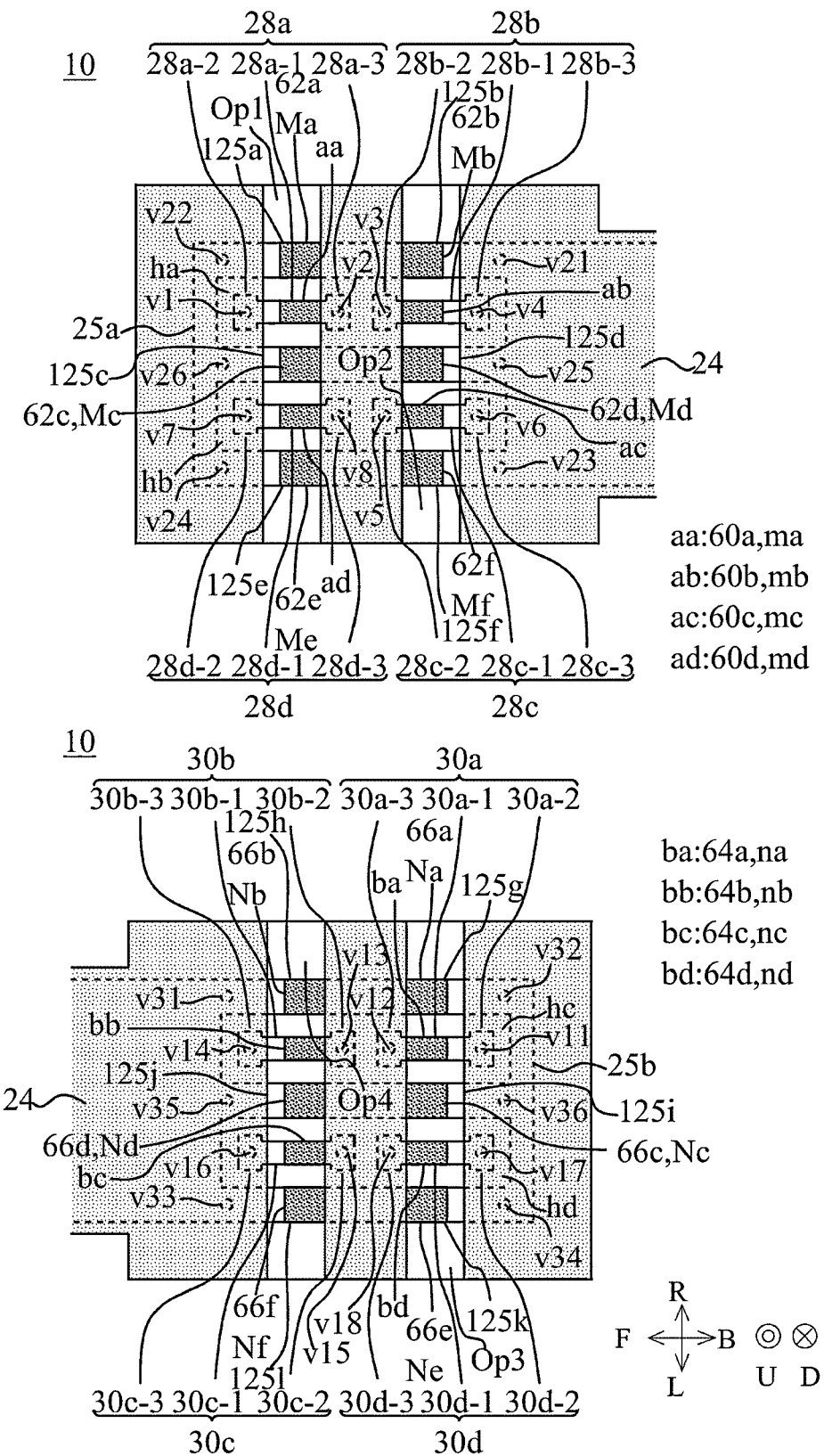
FIG. 2 includes a top view of a left end portion of the circuit board 10 and a top view of a right end portion of the circuit board 10.
Figure 3:
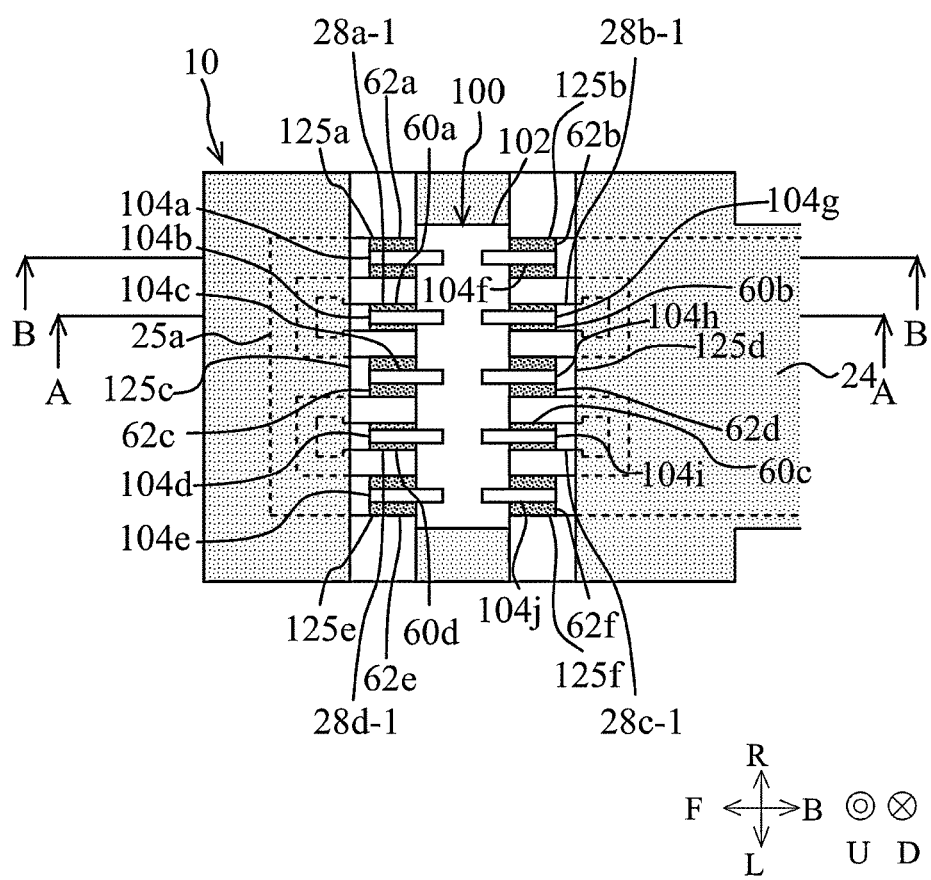
FIG. 3 includes a top view of a left end portion of an electronic-component-equipped circuit board 1 according to a preferred embodiment of the present invention and a top view of a right end portion of the circuit board 1.

The structure of a circuit board 10 according to a preferred embodiment of the present invention and the structure of an electronic-component-equipped circuit board 1 according to a preferred embodiment of the present invention will be described below with reference to the drawings. FIG. 1 is an exploded perspective view of the circuit board 10. FIG. 2 includes a top view of a left end portion of the circuit board 10 and a top view of a right end portion of the circuit board 10. FIG. 3 includes a top view of a left end portion of the electronic-component-equipped circuit board 1 and a top view of a right end portion of the circuit board 1. FIG. 4 includes a sectional view taken along line A-A of FIG. 3 and a sectional view taken along line B-B of FIG. 3.

In the present specification, directions are defined as follows. A lamination direction of a multilayer body 12 of the circuit board 10 is defined as the vertical direction. A direction in which signal conductor layers 22a to 22d of the circuit board 10 extend is defined as the longitudinal direction. A line width direction of the signal conductor layers 22a to 22d is defined as the transverse direction.

The vertical direction, the longitudinal direction, and the transverse direction are orthogonal to each other. The vertical direction, the longitudinal direction, and the transverse direction do not need to be the same as the vertical direction, the longitudinal direction, and the transverse direction during actual use of the circuit board 10.

The definitions of terms in the present specification will be described below. First, the positional relationships between members in the present specification will be defined. The members or components that are included in the circuit board 10 will be referred to as X to Z. In the present specification, when X and Y are arranged in the longitudinal direction, it implies that, when X and Y are viewed in a direction orthogonal or substantially orthogonal to the longitudinal direction, both X and Y are located on a straight line that indicates the longitudinal direction. In the present specification, when X and Y are arranged in the longitudinal direction when viewed in the vertical direction, it implies that, when X and Y are viewed in the vertical direction, both X and Y are located on a straight line that indicates the longitudinal direction. In this case, when X and Y are viewed from the transverse direction, which is different from the vertical direction, one of X and Y does not need to be located on the straight line indicating the longitudinal direction. X and Y may be in contact with each other. X and Y may be separated from each other. Z may be present between X and Y. This definition is also applied to the directions other than the longitudinal direction.

In the present specification, when X is disposed in front of Y, it implies that at least a portion of X is disposed in a region through which Y passes when Y performs a translational movement in a forward direction. Thus, X may be positioned within the region through which Y passes when Y performs a translational movement in the forward direction or may project from the region through which Y passes when Y performs a translational movement in the forward direction. In this case, X and Y are arranged in the longitudinal direction. This definition is also applied to the directions other than the longitudinal direction.

In the present specification, when X is disposed at a position further forward than Y, it implies that X is disposed in front of a plane that passes through a front end of Y and that is orthogonal or substantially orthogonal to the longitudinal direction.

In this case, X and Y may be arranged in the longitudinal direction or do not need to be arranged in the longitudinal direction. This definition is also applied to the directions other than the longitudinal direction.

In the present specification, the expression "X and Y are electrically connected to each other" implies that electricity can be conducted between X and Y. Thus, X and Y may be in contact with each other, or X and Y do not need to be in contact with each other. In the case where X and Y are not in contact with each other, Z having electrical conductivity is disposed between X and Y. In contrast, in the present specification, the expression "X and Y are connected to each other" implies that X and Y are connected to each other and in contact with each other.

In the following description, X is a component or a member of the circuit board 10. In the present specification, each portion of X is defined as follows unless otherwise stated. A front portion of X refers to a front half of X. A rear portion of X refers to a rear half of X. A left portion of X refers to a left half of X. A right portion of X refers to a right half of X. An upper portion of X refers to an upper half of X. A lower portion of X refers to a lower half of X. A front end of X refers to the end of X in the forward direction. A rear end of X refers to the end of X in the rearward direction. A left end of X refers to the end of X in the leftward direction. A right end of X refers to the end of X in the rightward direction. An upper end of X refers to the end of X in the upward direction. A lower end of X refers to the end of X in the downward direction. A front end portion of X refers to the front end of X and a peripheral portion. A rear end portion of X refers to the rear end of X and a peripheral portion. A left end portion of X refers to the left end of X and a peripheral portion. A right end portion of X refers to the right end of X and a peripheral portion. An upper end portion of X refers to the upper end of X and a peripheral portion. A lower end portion of X refers to the lower end of X and a peripheral portion.

The structure of the circuit board 10 will be described first with reference to FIG. 1. The circuit board 10 transmits a radio frequency signal. The circuit board 10 is used in an electronic device, for example, such as a smartphone, in order to electrically connect two circuits. As illustrated in FIG. 1, the circuit board 10 has a belt shape extending in the longitudinal direction. The circuit board 10 includes mounting regions A1 and A2 and a line region A3. The mounting region A1 includes signal electrodes 28a to 28d and a ground electrode 25a (a plurality of electrodes), which will be described later. The mounting region A2 includes signal electrodes 30a to 30d and a ground electrode 25b (a plurality of electrodes), which will be described later. The line region A3 is connected to the mounting regions A1 and A2 when viewed in the vertical direction and is a region in which the signal conductor layers 22a to 22d, which will be described later, extend. The mounting region A1, the line region A3, and the mounting region A2 are arranged in this order from the front side to the rear side. The width of the circuit board 10 in each of the mounting regions A1 and A2 in a direction orthogonal or substantially orthogonal to the direction in which the signal conductor layers 22a to 22d extend is larger than the width of the circuit board 10 in the line region A3 in the direction orthogonal or substantially orthogonal to the direction in which the signal conductor layers 22a to 22d extend. In the present preferred embodiment, the width of the circuit board 10 in each of the mounting regions A1 and A2 in the transverse direction is larger than the width of the circuit board 10 in the line region A3 in the transverse direction.

As illustrated in FIG. 1, the circuit board 10 includes the multilayer body 12, the signal conductor layers 22a to 22d, a first ground conductor layer 24, the ground electrodes 25a and 25b, a second ground conductor layer 26, the signal electrodes 28a to 28d, signal electrodes 30a to 30d, connection conductor layer 32a, 32c, 32e, 34a, 34c, and 34e, reinforcing members 50a and 50b, conductive bonding members 60a to 60d, 62a to 62f, 64a to 64d, 66a to 66f (see FIG. 2), plating layers ma to mf, Ma to Mf, na to nf, and Na to Nf, and interlayer connection conductors v1 to v8, v11 to v18, v21 to v26, and v31 to v36. In the circuit board 10, the ground electrodes 25a and 25b and the signal electrodes 28a to 28d and 30a to 30d are the plurality of electrodes. In other words, the plurality of electrodes include the ground electrodes 25a and 25b and the signal electrodes 28a to 28d and 30a to 30d.

The multilayer body 12 has a plate shape. Accordingly, the multilayer body 12 includes an upper main surface and a lower main surface. The vertical direction is a direction normal or substantially normal to the upper main surface and the lower main surface of the multilayer body 12. The upper main surface and the lower main surface of the multilayer body 12 each have a belt shape extending in the longitudinal direction. Thus, the length of the multilayer body 12 in the longitudinal direction is longer than the length of the multilayer body 12 in the transverse direction.

As illustrated in FIG. 1, the multilayer body 12 includes insulator layers 16a to 16c and a protective layer 20. The multilayer body 12 has a structure in which the insulator layers 16a to 16c and the protective layer 20 are laminated together in the vertical direction. The protective layer 20 and the insulator layers 16a to 16c are arranged in this order from the upper side to the lower side. When viewed in the vertical direction, the insulator layers 16a to 16c each have a belt shape the as that of the multilayer body 12. The insulator layers 16a to 16c are each a dielectric sheet having flexibility. The materials of the insulator layers 16a to 16c include, for example, a thermoplastic resin. The thermoplastic resin is, for example, a liquid crystal polymer or polytetrafluoroethylene (PTFE). The material of the insulator layers 16a to 16c may be, for example, a polyimide. In this case, the multilayer body 12 has flexibility. Consequently, the circuit board 10 can be bent and used. Bending the circuit board 10 refers to deforming the circuit board 10 by applying an external force to the circuit board 10. The deformation of the circuit board 10 may be elastic deformation or plastic deformation or may be both elastic deformation and plastic deformation. Details of the protective layer 20 will be described later.

The signal electrodes 28a to 28d are provided on the upper main surface of the insulator layer 16a (a first insulator layer), which is included in the insulator layers 16a to 16c. More specifically, the signal electrodes 28a to 28d are provided at a front end portion of the upper main surface of the insulator layer 16a. The signal electrodes 28a and 28b are arranged in this order from the front side to the rear side. The signal electrodes 28d and 28c are arranged in this order from the front side to the rear side. The signal electrodes 28a and 28b are located on the right-hand side of the signal electrodes 28d and 28c.

When viewed in the vertical direction, the signal electrodes 28a to 28d each have a belt shape extending in the longitudinal direction. The structure of the signal electrodes 28a to 28d will now be described in detail taking the signal electrode 28a as an example. As illustrated in FIG. 2, the signal electrode 28a includes a signal-electrode main body 28a-1, a signal-electrode first connecting portion 28a-2, and a signal-electrode second connecting portion 28a-3. When viewed in the vertical direction, the signal-electrode main body 28a-1 has a belt shape extending in the longitudinal direction. The signal-electrode first connecting portion 28a-2 is connected to the left end of the signal-electrode main body 28a-1. The signal-electrode second connecting portion 28a-3 is connected to the right end of the signal-electrode main body 28a-1. The width of the signal-electrode first connecting portion 28a-2 in the direction orthogonal to the direction in which the signal conductor layers 22a to 22d extend and the width of the signal-electrode second connecting portion 28a-3 in the direction orthogonal or substantially orthogonal to the direction in which the signal conductor layers 22a to 22d extend are each larger than the width of the signal-electrode main body 28a-1 in the direction orthogonal to the direction in which the signal conductor layers 22a to 22d extend. In the present preferred embodiment, the width of the signal-electrode first connecting portion 28a-2 in the transverse direction and the width of the signal-electrode second connecting portion 28a-3 in the transverse direction are each larger than the width of the signal-electrode main body 28a-1 in the transverse direction.

As illustrated in FIG. 2, mounting portions aa to ad are respectively located on portions of the signal electrodes 28a to 28d that are exposed from the circuit board 10. The mounting portions aa to ad are used to mount an electronic component (not illustrated) or a circuit board (not illustrated). Thus, when viewed in the vertical direction, the mounting portions aa to ad each overlap an electrode of the electronic component (not illustrated) or an electrode of the circuit board (not illustrated).

The plating layers ma to md are provided at the mounting portions aa to ad, respectively. The plating layers ma to md are respectively provided at portions of the signal electrodes 28a to 28d that are exposed from the circuit board 10. More specifically, the plating layers ma to md are respectively provided at the signal-electrode main body 28a-1, a signal-electrode main body 28b-1, a signal-electrode main body 28c-1, and a signal-electrode main body 28d-1.

As illustrated in FIG. 2, the conductive bonding members 60a to 60d are provided at the mounting portions aa to ad, respectively. Thus, the conductive bonding members 60a to 60d are provided at the plating layers ma to md, respectively.

As illustrated in FIG. 1, the signal conductor layers 22a to 22d are included in the multilayer body 12 so as to be located below the signal electrodes 28a to 28d. More specifically, the signal conductor layers 22a to 22d are provided on the upper main surface of the insulator layer 16b. The signal conductor layers 22a to 22d each have a linear shape. The signal conductor layers 22a to 22d extend in the longitudinal direction. The signal conductor layers 22a to 22d are arranged in this order from the right-hand side to the left-hand side. When viewed in the vertical direction, left end portions of the signal conductor layers 22a to 22d overlap the signal electrodes 28a to 28d, respectively. The left end portion of the signal conductor layer 22a is located in front of the left end portion of the signal conductor layer 22b. Accordingly, the signal conductor layer 22a extends on the right-hand side of the connection conductor layer 32a, which will be described later, from the rear side to the front side and further extends in front of the connection conductor layer 32a from the right-hand side to the left-hand side. Similarly, the left end portion of the signal conductor layer 22d is located in front of the left end portion of the signal conductor layer 22c. Accordingly, the signal conductor layer 22d extends on the left-hand side of the connection conductor layer 32c from the rear side to the front side and further extends in front of the connection conductor layer 32c from the left-hand side to the right-hand side. A radio frequency signal is transmitted to the signal conductor layers 22a to 22d such as those described above.

As illustrated in FIG. 1, the first ground conductor layer 24 is provided on the insulator layer 16a. More specifically, the first ground conductor layer 24 is provided on the upper main surface of the insulator layer 16a in the line region A3. Accordingly, the first ground conductor layer 24 is located above the signal conductor layers 22a to 22d. In addition, in the line region A3, the first ground conductor layer 24 covers a large portion of the upper main surface of the insulator layer 16a. Consequently, the first ground conductor layer 24 overlaps the signal conductor layers 22a to 22d when viewed in the vertical direction. The first ground conductor layer 24 is connected to a ground potential.

As illustrated in FIG. 1, the second ground conductor layer 26 is provided on the insulator layer 16c. More specifically, the second ground conductor layer 26 is provided on the upper main surface of the insulator layer 16c. Accordingly, the second ground conductor layer 26 is located below the signal conductor layers 22a to 22d. In addition, the second ground conductor layer 26 covers a large portion of the upper main surface of the insulator layer 16c. Consequently, the second ground conductor layer 26 overlaps the signal conductor layers 22a to 22d when viewed in the vertical direction. The second ground conductor layer 26 is connected to the ground potential. As a result, the signal conductor layers 22a to 22d, the first ground conductor layer 24, and the second ground conductor layer 26 have a stripline structure.

As illustrated in FIG. 1, the ground electrode 25a is provided on the upper main surface of the insulator layer 16a in the mounting region A1. The ground electrode 25a is connected to the left end of the first ground conductor layer 24. As illustrated in FIG. 2, the ground electrode 25a surrounds the signal electrodes 28a to 28d when viewed in the vertical direction. More specifically, when viewed in the vertical direction, the ground electrode 25a has a frame shape. When viewed in the vertical direction, the ground electrode 25a has a rectangular or substantially rectangular shape with a front side extending in the transverse direction, a rear side extending in the transverse direction, a left side extending in the longitudinal direction, and a right side extending in the longitudinal direction. The ground electrode 25a has a structure in which the center of the front side and the center of the rear side are connected to each other by a conductor layer extending in the longitudinal direction. Thus, the ground electrode 25a includes openings ha and hb. The openings ha and hb each have a rectangular or substantially rectangular shape when viewed in the vertical direction. The openings ha and hb are arranged in this order from the right-hand side to the left-hand side. When viewed in the vertical direction, the signal electrodes 28a and 28b are located in the opening ha. When viewed in the vertical direction, the signal electrodes 28c and 28d are located in the opening hb.

As illustrated in FIG. 1, the connection conductor layers 32a, 32c, and 32e are provided on the insulator layer 16b. More specifically, the connection conductor layers 32a, 32c, and 32e are provided at a front end portion of the upper main surface of the insulator layer 16b. When viewed in the vertical direction, the connection conductor layers 32a, 32c, and 32e each have a belt shape extending in the longitudinal direction. In addition, the connection conductor layer 32a is located on the right-hand side of the connection conductor layer 32e. The connection conductor layer 32c is located on the left-hand side of the connection conductor layer 32e. The connection conductor layers 32a, 32c, and 32e such as those described above overlap the ground electrode 25a when viewed in the vertical direction.

As illustrated in FIG. 1, the interlayer connection conductor v1 (a first interlayer connection conductor) and the interlayer connection conductor v2 (a second interlayer connection conductor) extend through the insulator layer 16a (the first insulator layer) in the vertical direction and electrically connect the signal electrode 28a and the signal conductor layer 22a to each other. However, as illustrated in FIG. 2, the interlayer connection conductors v1 (the first interlayer connection conductor) and the interlayer connection conductor v2 (the second interlayer connection conductor) are electrically connected to the signal electrode 28a so as not to overlap the mounting portion aa, which is provided at the signal electrode 28a when viewed in the vertical direction. In other words, as illustrated in FIG. 2, the interlayer connection conductor v1 (the first interlayer connection conductor) and the interlayer connection conductor v2 (the second interlayer connection conductor) are electrically connected to the signal electrode 28a so as not to overlap the plating layer ma and the conductive bonding member 60a, which are provided at the signal electrode 28a, when viewed in the vertical direction. Accordingly, the interlayer connection conductor v1 (the first interlayer connection conductor) is connected to the signal-electrode first connecting portion 28a-2. Thus, the interlayer connection conductor v1 (the first interlayer connection conductor) is connected to the signal electrode 28a at a position further forward than the conductive bonding member 60a, which is provided at the signal electrode 28a. The interlayer connection conductor v2 (the second interlayer connection conductor) is connected to the signal-electrode second connecting portion 28a-3. Thus, the interlayer connection conductor v2 (the second interlayer connection conductor) is connected to the signal electrode 28a at a position further rearward than the conductive bonding member 60a, which is provided at the signal electrode 28a. As a result, the interlayer connection conductor v1 (the first interlayer connection conductor), the conductive bonding member 60a provided at the signal electrode 28a, and the interlayer connection conductor v2 (the second interlayer connection conductor) are arranged in a line in this order from the front side to the rear side. The interlayer connection conductor v1 and the interlayer connection conductor v2 are connected in parallel to each other between the left end portion of the signal conductor layer 22a and the signal electrode 28a. The structures of the interlayer connection conductors v3, v5, and v7 are each the same or substantially the same as that of the interlayer connection conductor v1, and thus, the descriptions thereof will be omitted. The structures of the interlayer connection conductors v4, v6, and v8 are each the same or substantially the same as that of the interlayer connection conductor v2, and thus, the descriptions thereof will be omitted.

As illustrated in FIG. 1, the interlayer connection conductors v21 to v26 (third interlayer connection conductors)

extend through the insulator layer 16a (the first insulator layer) and the insulator layer 16b in the vertical direction and electrically connect the ground electrode 25a and the second ground conductor layer 26 to each other. As illustrated in FIG. 4, when viewed in the direction in which the interlayer connection conductor v1 (the first interlayer connection conductor) and the interlayer connection conductor v2 (the second interlayer connection conductor) are arranged and in the direction orthogonal or substantially orthogonal to the vertical direction, the interlayer connection conductors v21 to v26 (the third interlayer connection conductors) do not overlap the interlayer connection conductor v1 (the first interlayer connection conductor) and the interlayer connection conductor v2 (the second interlayer connection conductor). In the present preferred embodiment, the interlayer connection conductors v21 to v26 do not overlap the interlayer connection conductor v1 and the interlayer connection conductor v2 when viewed in the transverse direction. Accordingly, as illustrated in FIG. 2, the interlayer connection conductor v21 is connected to a right end portion of the rear side of the ground electrode 25a when viewed in the vertical direction. The interlayer connection conductor v22 is connected to a right end portion of the front side of the ground electrode 25a when viewed in the vertical direction. The interlayer connection conductor v23 is connected to a left end portion of the rear side of the ground electrode 25a when viewed in the vertical direction. The interlayer connection conductor v24 is connected to a left end portion of the front side of the ground electrode 25a when viewed in the vertical direction. The interlayer connection conductor v25 is connected to a center portion of the rear side of the ground electrode 25a when viewed in the vertical direction. The interlayer connection conductor v26 is connected to a center portion of the front side of the ground electrode 25a when viewed in the vertical direction.

The protective layer 20 is, for example, an insulator layer. However, the protective layer 20 is made of a material different from the material of the insulator layers 16a to 16c. The protective layer 20 is, for example, a resist layer. Thus, for example, the protective layer 20 may be formed by attaching a resin sheet to the upper main surface of the insulator layer 16a or may be formed by applying a liquid resin to the upper main surface of the insulator layer 16a. As illustrated in FIG. 2, the protective layer 20 covers the signal electrodes 28a to 28d and the ground electrode 25a (the plurality of electrodes). However, the protective layer 20 includes openings Op1 and Op2 provided in the protective layer 20. At least a portion of the signal electrodes 28a to 28d is exposed to the outside from the circuit board 10 through the openings Op1 and Op2. In the present preferred embodiment, the signal-electrode main bodies 28a-1 to 28d-1 are exposed to the outside from the circuit board 10. Consequently, the mounting portions aa and ad are located in the opening Op1. The mounting portions ab and ac are located in the opening Op2. The signal-electrode first connecting portion 28a-2 and signal-electrode first connecting portions 28b-2 to 28d-2 are covered with the protective layer 20 when viewed in the vertical direction. The signal-electrode second connecting portion 28a-3 and signal-electrode second connecting portions 28b-3 to 28d-3 are covered with the protective layer 20 when viewed in the vertical direction. As a result, the interlayer connection conductors v1 to v8 (the first interlayer connection conductors and the second interlayer connection conductors) overlap the protective layer 20 when viewed in the vertical direction. In other words, the interlayer connection conductors v1 to v8 do not overlap the openings Op1 and Op2 of the protective layer 20.

The ground electrode 25a is partially exposed to the outside from the circuit board 10 through the openings Op1 and Op2. Hereinafter, portions of the ground electrode 25a that are exposed to the outside from the circuit board 10 will be defined as exposed portions 125a to 125f. The exposed portion 125a is located on the right-hand side of the signal-electrode main body 28a-1. The exposed portion 125b is located on the right-hand side of the signal-electrode main body 28b-1. The exposed portion 125c is located on the left-hand side of the signal-electrode main body 28a-1. The exposed portion 125d is located on the left-hand side of the signal-electrode main body 28b-1. The exposed portion 125e is located on the left-hand side of the signal-electrode main body 28d-1. The exposed portion 125f is located on the left-hand side of a signal-electrode main body 28c-1.

Since the protective layer 20 has the above-described structure, the exposed portion 125a, the signal-electrode main body 28a-1, the exposed portion 125c, the signal-electrode main body 28d-1, and the exposed portion 125e are arranged in this order from the right-hand side to the left-hand side. The exposed portion 125b, the signal-electrode main body 28b-1, the exposed portion 125d, the signal-electrode main body 28c-1, and the exposed portion 125f are arranged in this order from the right-hand side to the left-hand side. As described above, in the circuit board 10, the signal electrodes 28a and 28d and the ground electrode 25a (the plurality of electrodes) are arranged in the transverse direction. The signal electrodes 28b and 28c and the ground electrode 25a (the plurality of electrodes) are arranged in the transverse direction.

As illustrated in FIG. 2, the plating layers Ma to Mf are provided at the ground electrode 25a (electrode). More specifically, the plating layers Ma to Md are respectively provided at the exposed portions 125a to 125f.

As illustrated in FIG. 2, the conductive bonding members 62a to 62f are respectively provided at the plating layers Ma to Mf.

As illustrated in FIG. 1, the reinforcing member 50a is fixed to the lower main surface of the multilayer body 12 in the mounting region A1. More specifically, the reinforcing member 50a is fixed to the lower main surface of the multilayer body 12 by a bonding layer 70a (see FIG. 4) in the mounting region A1. As a result, as illustrated in FIG. 4, the thickness of the circuit board 10 in the vertical direction in the mounting region A1 is larger than the thickness of the circuit board 10 in the vertical direction in the line region A3. The reinforcing member 50a reduces or prevents the occurrence of deformation of the circuit board 10 in the mounting region A1. Accordingly, the Young's modulus of the material of the reinforcing member 50a is, for example, greater than the Young's modulus of the material of the multilayer body 12. The material of the reinforcing member 50a is, for example, a metal such as SUS (steel use stainless).

The signal conductor layers 22a to 22d, the first ground conductor layer 24, the ground electrodes 25a and 25b, the second ground conductor layer 26, the signal electrodes 28a to 28d and 30a to 30d, the connection conductor layers 32a, 32c, 32e, 34a, 34c, and 34e are formed, for example, by patterning a metal foil attached to the upper main surfaces of the insulator layers 16a to 16c. The metal foil is, for example, a copper foil. The interlayer connection conductors v1 to v8, v11 to v18, v21 to v26, and v31 to v36 are formed by, for example, forming through holes in the insulator layers 16a and 16b, filling the through holes with an electrically conductive paste, and solidifying the electrically conductive paste by heating. The conductive bonding members 60a to 60d, 62a to 62f, 64a to 64d, and 66a to 66f are made of solder.

The structure of a left portion of the circuit board 10 has been described above. The structure of a right portion of the circuit board 10 is mirror symmetric to the structure of the left portion of the circuit board 10. Thus, the description of the structure of a right portion of the circuit board 10 will be omitted.

Next, the structure of the electronic-component-equipped circuit board 1 will be described. The electronic-component-equipped circuit board 1 includes the circuit board 10 and a connector 100 (an electronic component). As illustrated in FIG. 3 and FIG. 4, the connector 100 (the electronic component) is mounted on the circuit board 10.

As illustrated in FIG. 3, the connector 100 includes a connector main body 102 and terminals 104a to 104j. The connector main body 102 is a component made of, for example, a resin. The connector main body 102 has a rectangular or substantially rectangular shape when viewed in the vertical direction. The terminals 104a to 104j are fixed to the connector main body 102. The terminals 104a to 104e project forward from the connector main body 102. The terminals 104a to 104e are arranged in this order from the right-hand side to the left-hand side. The terminals 104f to 104j project rearward from the connector main body 102. The terminals 104f to 104j are arranged in this order from the right-hand side to the left-hand side.

The terminals 104a to 104e, such as those described above, are respectively fixed to the plating layer Ma, the plating layer ma, the plating layer Mc, the plating layer Md, and the plating layer Me by the conductive bonding members 62a, 60a, 62c, 60d, and 62e. The terminals 104f to 104j are respectively fixed to the plating layer Mb, the plating layer mb, the plating layer md, the plating layer Mc, and the plating layer mf by the conductive bonding members 62b, 60b, 62d, 60c, and 62f. In this manner, the conductive bonding members 60a to 60d and 62a to 62f electrically connect the terminals 104a to 104f of the connector 100 (the electronic component) to their respective plating layers ma to md and Ma to Md. When the connector 100 is mounted on the circuit board 10, the conductive bonding members 60a to 60d and 62a to 62f extend in the longitudinal direction and the transverse direction. However, even in a state where the connector 100 is mounted on the circuit board 10, the interlayer connection conductors v1 to v8 do not overlap the conductive bonding members 60a to 60d when viewed in the vertical direction. The connector 100 overlaps the protective layer 20 when viewed in the vertical direction.

The connector 100 relays electrical connection between the circuit board 10 and another circuit board by being connected to another connector (not illustrated) that is mounted on the other circuit board.

Advantageous Effects

According to the circuit board 10, a radio-frequency signal loss can be reduced or prevented. More specifically, in the circuit board 10, the signal electrodes 28a and 28d and the ground electrode 25a are arranged in the transverse direction. In addition, the signal electrodes 28b and 28c and the ground electrode 25a are arranged in the transverse direction. Thus, the widths of the signal electrodes 28a to 28d in the transverse direction are likely to be small. Therefore, the resistances of the signal electrodes 28a to 28d are likely to increase.

Accordingly, in the circuit board 10, the interlayer connection conductors v1 and v2 extend through the insulator layer 16a in the vertical direction and electrically connect the signal electrode 28a and the signal conductor layer 22a to each other. In other words, the interlayer connection conductor v1 and the interlayer connection conductor v2 are connected in parallel to each other between the left end portion of the signal conductor layer 22a and the signal electrode 28a. Consequently, the resistance between the left end portion of the signal conductor layer 22a and the signal electrode 28a is reduced. As a result, according to the circuit board 10, a radio-frequency signal loss can be reduced or prevented.

According to the circuit board 10, the connector 100 (the electronic component) can be easily mounted onto the circuit board 10. The signal electrode 28a will be described below as an example. Since each of the interlayer connection conductors v1 and v2 is harder than the multilayer body 12, portions of the multilayer body 12 that overlap the interlayer connection conductors v1 and v2 in the vertical direction are likely to protrude upward when pressure bonding of the multilayer body 12 is performed. Thus, in the case where the interlayer connection conductors v1 and v2 overlap the mounting portion aa when viewed in the vertical direction, a portion of the signal electrode 28a at which the mounting portion aa is located is likely to protrude upward. As a result, it may sometimes be difficult to mount the connector 100 onto the circuit board 10. Accordingly, in the circuit board 10, the interlayer connection conductor v1 and the interlayer connection conductor v2 do not overlap the mounting portion aa, which are provided at the signal electrode 28a, when viewed in the vertical direction. This reduces or prevents the portion of the signal electrode 28a at which the mounting portion aa is located from protruding upward. As a result, according to the circuit board 10, the connector 100 can be easily mounted onto the circuit board 10. If the connector 100 is reduced in size, the degree of difficulty in mounting the connector 100 increases. Thus, also from the standpoint of reducing the size of the connector 100, it is preferable that the connector 100 can be easily mounted onto the circuit board 10.

According to the circuit board 10, the portions of the multilayer body 12 that overlap the interlayer connection conductors v1 and v2 are protected. More specifically, since each of the interlayer connection conductors v1 and v2 is harder than the multilayer body 12, the portions of the multilayer body 12 that overlap the interlayer connection conductors v1 and v2 in the vertical direction are likely to protrude upward when pressure bonding of the multilayer body 12 is performed. Thus, the portions of the multilayer body 12 that overlap the interlayer connection conductors v1 and v2 in the vertical direction are likely to break. Consequently, the interlayer connection conductors v1 and v2 overlap the protective layer 20 when viewed in the vertical direction. As a result, the portions of the multilayer body 12 that overlap the interlayer connection conductors v1 and v2 are protected.

In the circuit board 10, the width of the circuit board 10 in the mounting region A1 in the transverse direction is larger than the width of the circuit board 10 in the line region A3 in the direction orthogonal or substantially orthogonal to the direction in which the signal conductor layers 22a to 22d extend. Consequently, deformation of the circuit board 10 is less likely to occur in the mounting region A1 than in the line region A3. As a result, the connector 100 (the electronic component) can be easily mounted onto the circuit board 10.

In the circuit board 10, the thickness of the circuit board 10 in the vertical direction in the mounting region A1 is larger than the thickness of the circuit board 10 in the vertical direction in the line region A3. Consequently, deformation of the circuit board 10 is less likely to occur in the mounting region A1 than in the line region A3. As a result, the connector 100 (the electronic component) can be easily mounted onto the circuit board 10.

In the circuit board 10, the reinforcing member 50a is fixed to the lower main surface of the multilayer body 12 in the mounting region A1. This further reduces the likelihood of deformation of the circuit board 10 in the mounting region A1. As a result, the connector 100 (the electronic component) can be easily mounted onto the circuit board 10.

In the circuit board 10, the width of the signal-electrode first connecting portion 28a-2 in the transverse direction and the width of the signal-electrode second connecting portion 28a-3 in the transverse direction are each larger than the width of the signal-electrode main body 28a-1 in the transverse direction. Consequently, the resistance of the signal electrode 28a decreases. As a result, according to the circuit board 10, a radio-frequency signal loss can be reduced or prevented. In addition, in the longitudinal direction, the signal-electrode first connecting portion 28a-2 and the signal-electrode second connecting portion 28a-3 are shifted from the signal-electrode main body 28a-1 to which the terminal 104b is connected. Therefore, the gaps between the signal electrodes 28a to 28d and the ground electrode 25a can be reduced.

In the circuit board 10, the ground electrode 25a surrounds the signal electrodes 28a to 28d when viewed in the vertical direction. This reduces or prevents radiation of noise from the signal electrodes 28a to 28d and entry of noise into the signal electrodes 28a to 28d. In addition, the interlayer connection conductors v21 to v26 reduce or prevent radiation of noise from the signal electrodes 28a to 28d and entry of noise into the signal electrodes 28a to 28d.

According to the circuit board 10, an alternating-current resistance that is generated in the interlayer connection conductors v1 and v2 is reduced. More specifically, the interlayer connection conductors v21 to v26 electrically connect the ground electrode 25a and the second ground conductor layer 26 to each other. When viewed in the direction in which the interlayer connection conductor v1 and the interlayer connection conductor v2 are arranged and in a direction orthogonal or substantially orthogonal to the vertical direction, each of the interlayer connection conductors v21 to v26 does not overlap either the interlayer connection conductor v1 or the interlayer connection conductor v2. As a result, the interlayer connection conductors v21 to v26 are separated from the interlayer connection conductor v1 and the interlayer connection conductor v2. Thus, the probability that a capacitance will be generated between the interlayer connection conductors v21 to v26 and the interlayer connection conductor v1 is reduced, and the probability that a capacitance will be generated between the interlayer connection conductors v21 to v26 and the interlayer connection conductor v2 is reduced. Accordingly, transmission of the radio frequency signal, which is transmitted through the interlayer connection conductors v1 and v2, to the interlayer connection conductors v21 to v26 via a capacitance is reduced or prevented. In other words, transmission of the radio frequency signal, which is transmitted through the interlayer connection conductors v1 and v2, to the ground is reduced or prevented. As a result, according to the circuit board 10, the alternating-current resistance that is generated in the interlayer connection conductors v1 and v2 is reduced.

First Modification

Figure 5:
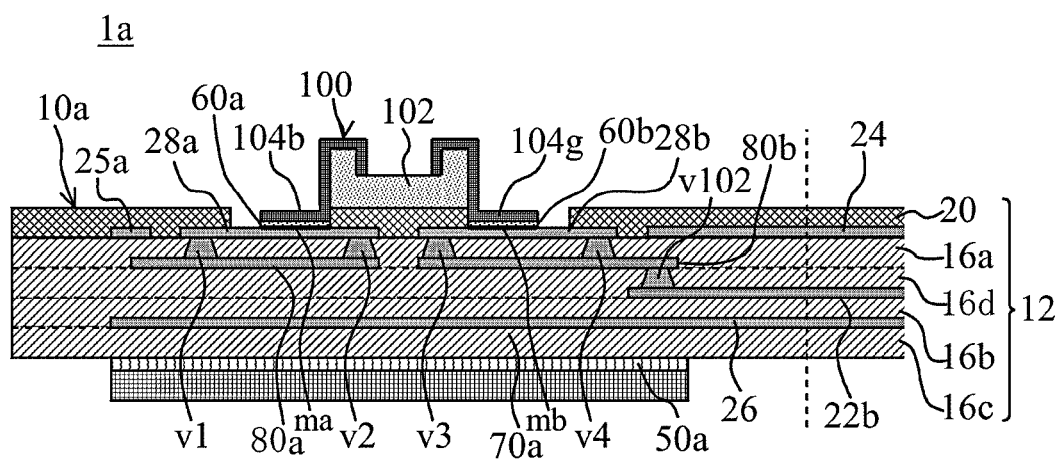
FIG. 5 is a sectional view of an electronic-component-equipped circuit board 1a according to a preferred embodiment of the present invention.

A circuit board 10a according to a first modification of a preferred embodiment of the present invention and an electronic-component-equipped circuit board 1a according to the first modification will be described below with reference to the drawings. FIG. 5 is a sectional view of the electronic-component-equipped circuit board 1a.

The circuit board 10a is different from the circuit board 10 in that the circuit board 10a includes an insulator layer 16d, connection conductor layers 80a to 80d, and interlayer connection conductors v101 to v104. The connection conductor layers 80c and 80d and the interlayer connection conductors v101, v103, and v104 are not illustrated in FIG. 5. The connection conductor layer 80b and the interlayer connection conductor v102 will be described below as an example.

The insulator layer 16d is laminated between the insulator layer 16a and the insulator layer 16b. The connection conductor layer 80b is provided at the insulator layer 16d. In the present preferred embodiment, the connection conductor layer 80b is provided on the upper main surface of the insulator layer 16d. The interlayer connection conductor v102 extends through the insulator layer 16d in the vertical direction and connects the connection conductor layer 80b and the signal conductor layer 22b to each other.

The interlayer connection conductor v3 (the first interlayer connection conductor) and the interlayer connection conductor v4 (the second interlayer connection conductor) are connected to each other by the connection conductor layer 80b. When viewed in the vertical direction, the interlayer connection conductor v102 (a fourth interlayer connection conductor) does not overlap either the interlayer connection conductor v3 (the first interlayer connection conductor) or the interlayer connection conductor v4 (the second interlayer connection conductor). The rest of the structure of the circuit board 10a is the same or substantially the same as that of the circuit board 10, and thus, the description thereof will be omitted.

In the circuit board 10a, the interlayer connection conductor v102 does not overlap either the interlayer connection conductor v3 or the interlayer connection conductor v4 when viewed in the vertical direction. This reduces or prevents the signal electrode 28b from protruding upward.

In the circuit board 10a, the interlayer connection conductor v102 does not overlap either the interlayer connection conductor v3 or the interlayer connection conductor v4 when viewed in the vertical direction. In addition, the interlayer connection conductor v102 is positioned farther rearward than the interlayer connection conductors v3 and v4. As a result, the length of the signal conductor layer 22b is reduced. Thus, the resistance of the signal conductor layer 22b decreases. In addition, the capacitance generated in the signal conductor layer 22b is reduced.

Second Modification

A circuit board 10b according to a second modification of a preferred embodiment of the present invention and an electronic-component-equipped circuit board 1b according to the second modification will be described below with reference to the drawings. FIG. 6 is a sectional view of the electronic-component-equipped circuit board 1b.

The circuit board 10b is different from the circuit board 10a in that the circuit board 10b includes interlayer connection conductors v201 to v204. The interlayer connection conductors v201, v203, and v204 are not illustrated in FIG. 6. The connection conductor layer 80b and the interlayer connection conductors v102 and v202 will be described below as an example.

When viewed in the vertical direction, the interlayer connection conductor v202 is located between the interlayer connection conductor v3 and the interlayer connection conductor v4. The interlayer connection conductor v202 electrically connects the connection conductor layer 80b and the signal conductor layer 22b to each other. The rest of the structure of the circuit board 10b is the same or substantially the same as that of the circuit board 10a, and thus, the description thereof will be omitted.

According to the circuit board 10b, the interlayer connection conductor v102 and the interlayer connection conductor v202 are connected in parallel to each other between the connection conductor layer 80b and the signal conductor layer 22b. As a result, the resistance between the signal conductor layer 22b and the signal electrode 28b decreases.

The interlayer connection conductor v202 is provided at the insulator layer 16d disposed below the insulator layer 16a. Thus, the interlayer connection conductor v202 is less likely to affect the flatness of the signal electrode 28b. Therefore, the interlayer connection conductor v202 may overlap the mounting portion ab, the plating layer mb, and the conductive bonding member 60b when viewed in the vertical direction.

Third Modification

Figure 7:
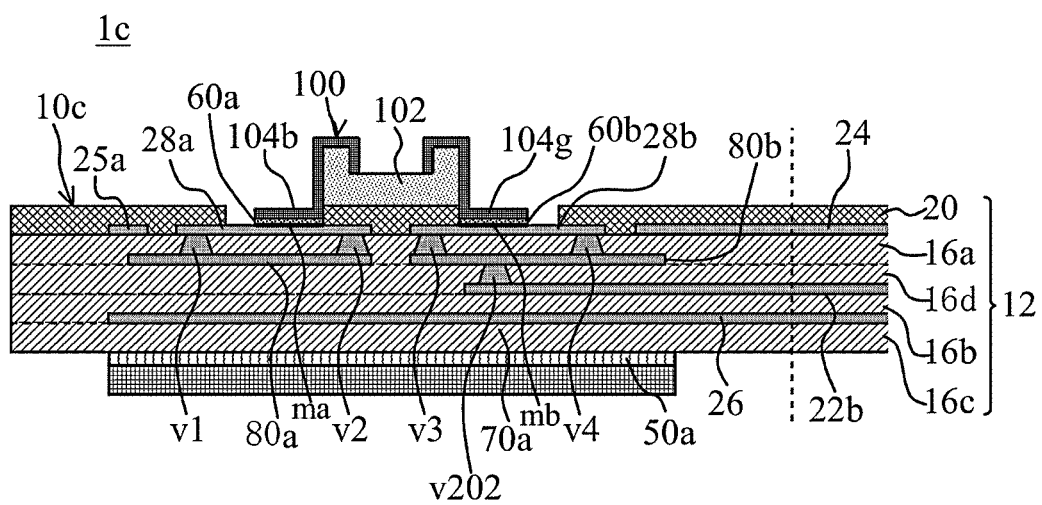
FIG. 7 is a sectional view of an electronic-component-equipped circuit board 1c according to a preferred embodiment of the present invention.

A circuit board 10c according to a third modification of a preferred embodiment of the present invention and an electronic-component-equipped circuit board 1c according to the third modification will be described below with reference to the drawings. FIG. 7 is a sectional view of the electronic-component-equipped circuit board 1c.

The circuit board 10c is different from the circuit board 10b in that the circuit board 10c does not include the interlayer connection conductors v101 to v104. As described above, the interlayer connection conductors v101 to v104 do not need to be provided as long as the interlayer connection conductors v201 to v204 are provided.

Fourth Modification

Figure 8:
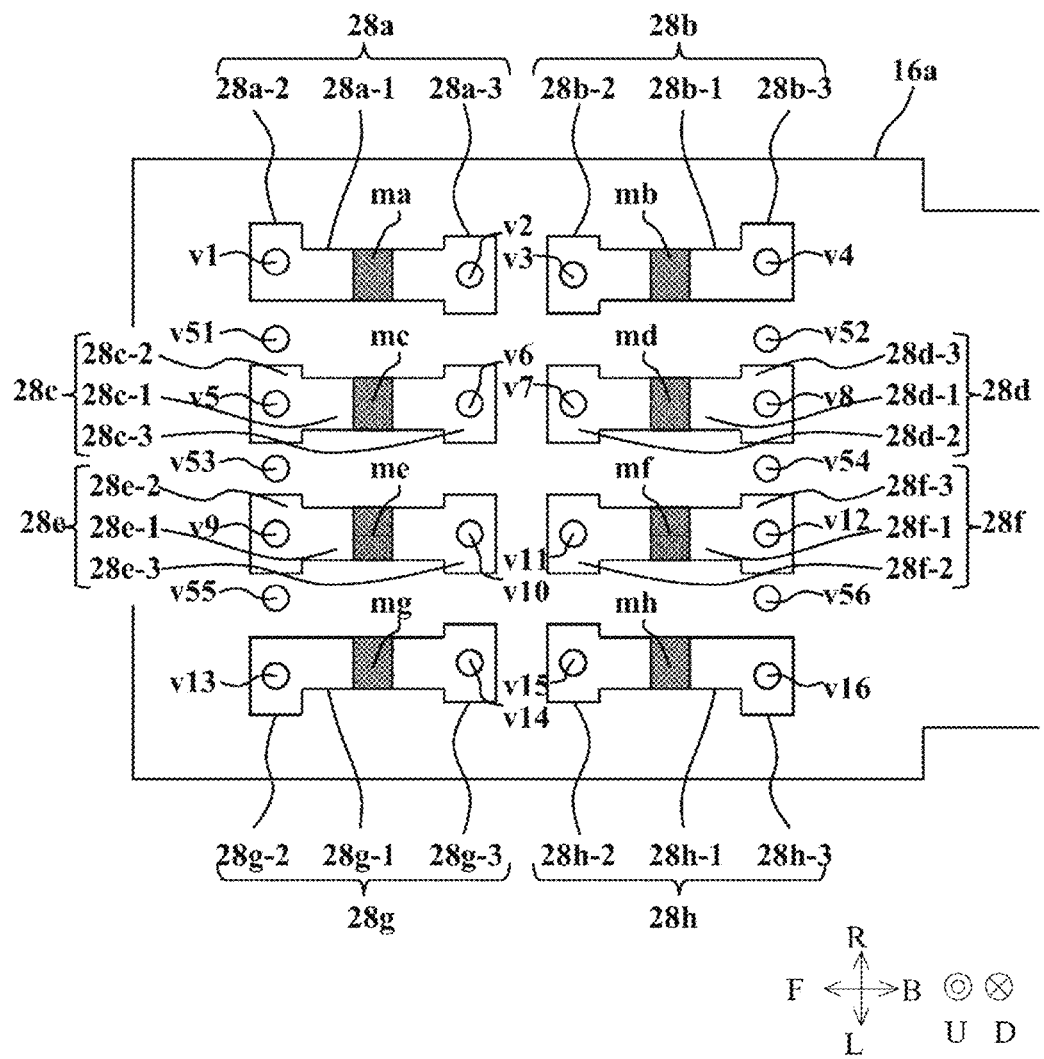
FIG. 8 is a top view of a left end portion of an insulator layer 16a of a circuit board 10d according to a preferred embodiment of the present invention.

A circuit board 10d according to a fourth modification of a preferred embodiment of the present invention will be described below with reference to the drawings. FIG. 8 is a top view of a left end portion of the insulator layer 16a of the circuit board 10d.

The circuit board 10d includes the signal electrodes 28a to 28d, signal electrodes 28e to 28h, and interlayer connection conductors v51 to v56. The signal electrodes 28a, 28c, 28e, and 28g are arranged in this order from the right-hand side to the left-hand side. The signal electrodes 28b, 28d, 28f, and 28h are arranged in this order from the right-hand side to the left-hand side. The signal electrodes 28b, 28d, 28f, and 28h are respectively located behind the signal electrodes 28a, 28c, 28e, and 28g.

The signal electrode 28a includes the signal-electrode main body 28a-1, the signal-electrode first connecting portion 28a-2, and the signal-electrode second connecting portion 28a-3. The signal-electrode main body 28a-1 extends in the longitudinal direction. The signal-electrode first connecting portion 28a-2 is connected to the left end of the signal-electrode main body 28a-1. The signal-electrode second connecting portion 28a-3 is connected to the right end of the signal-electrode main body 28a-1. The width of the signal-electrode first connecting portion 28a-2 in the transverse direction and the width of the signal-electrode second connecting portion 28a-3 in the transverse direction are each larger than the width of the signal-electrode main body 28a-1 in the transverse direction. The structures of the signal electrodes 28b to 28h are each the same or substantially the same as that of the signal electrode 28a, and thus, the descriptions thereof will be omitted.

The interlayer connection conductors v51 to v56 extend through the insulator layer 16a in the vertical direction. The ground potential is connected to the interlayer connection conductors v51 to v56. The interlayer connection conductor v51 is located between the signal-electrode first connecting portion 28a-2 and the signal-electrode first connecting portion 28c-2. The interlayer connection conductor v52 is located between the signal-electrode second connecting portion 28b-3 and the signal-electrode second connecting portion 28d-3. The interlayer connection conductor v53 is located between the signal-electrode first connecting portion 28c-2 and a signal-electrode first connecting portion 28e-2. The interlayer connection conductor v54 is located between the signal-electrode second connecting portion 28d-3 and a signal-electrode second connecting portion 28f-3. The interlayer connection conductor v55 is located between the signal-electrode first connecting portion 28e-2 and a signal-electrode first connecting portion 28g-2. The interlayer connection conductor v56 is located between the signal-electrode second connecting portion 28f-3 and a signal-electrode second connecting portion 28h-3.

The center of the signal-electrode first connecting portion 28a-2 in the transverse direction is located farther toward the right-hand side than the center of the signal-electrode second connecting portion 28a-3 in the transverse direction. The center of the signal-electrode second connecting portion 28b-3 in the transverse direction is located farther toward the right-hand side than the center of the signal-electrode first connecting portion 28b-2 in the transverse direction. The center of the signal-electrode first connecting portion 28g-2 in the transverse direction is located farther toward the left-hand side than the center of a signal-electrode second connecting portion 28g-3 in the transverse direction. The center of the signal-electrode second connecting portion 28h-3 is located farther toward the left-hand side than the center of a signal-electrode first connecting portion 28h-2 in the transverse direction.

In the circuit board 10d having a structure such as that described above, the distance between the signal-electrode first connecting portion 28a-2 and the signal-electrode first connecting portion 28c-2 is large, and thus, the interlayer connection conductor v51 may be easily disposed between the signal-electrode first connecting portion 28a-2 and the signal-electrode first connecting portion 28c-2. For the same reason, the interlayer connection conductors v52, v55, and v56 may be easily disposed.

Fifth Modification

Figure 9:
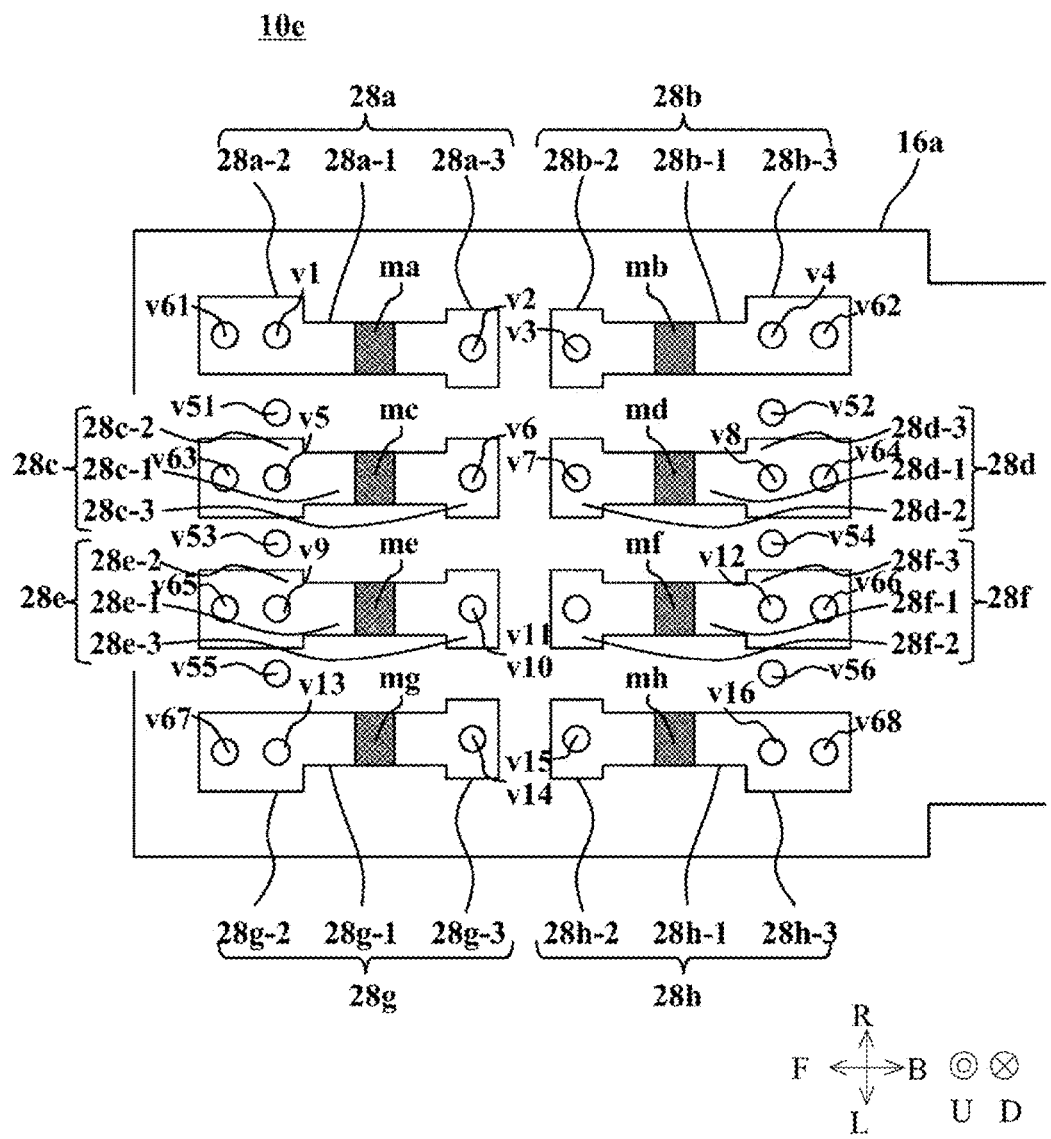
FIG. 9 is a top view of a left end portion of an insulator layer 16a of a circuit board 10e according to a preferred embodiment of the present invention.

A circuit board 10e according to a fifth modification of a preferred embodiment of the present invention will be described below with reference to the drawings. FIG. 9 is a top view of a left end portion of the insulator layer 16a of the circuit board 10e.

The circuit board 10e is different from the circuit board 10d in that the circuit board 10e further includes interlayer connection conductors v61 to v68. More specifically, the interlayer connection conductors v61, v63, v65, and v67 are respectively located in front of the interlayer connection conductors v1, v5, v9, and v13. The interlayer connection conductors v61, v63, v65, and v67 are respectively connected to the signal-electrode first connecting portions 28a-2, 28c-2, 28e-2, and 28g-2. The interlayer connection conductors v62, v64, v66, and v68 are respectively located behind the interlayer connection conductors v4, v8, v12, and v16. The interlayer connection conductors v62, v64, v66, and v68 are respectively connected to the signal-electrode first connecting portion 28b-2, the signal-electrode first connecting portion 28d-2, a signal-electrode first connecting portion 28f-2, and the signal-electrode first connecting portion 28h-2. In the circuit board 10e, the interlayer connection conductors v61, v63, v65, and v67 are respectively connected in parallel to the interlayer connection conductors v1, v5, v9, and v13. The interlayer connection conductors v62, v64, v66, and v68 are respectively connected in parallel to the interlayer connection conductors v4, v8, v12, and v16. As a result, the direct-current resistance of the circuit board 10e is reduced.

Sixth Modification

Figure 10:
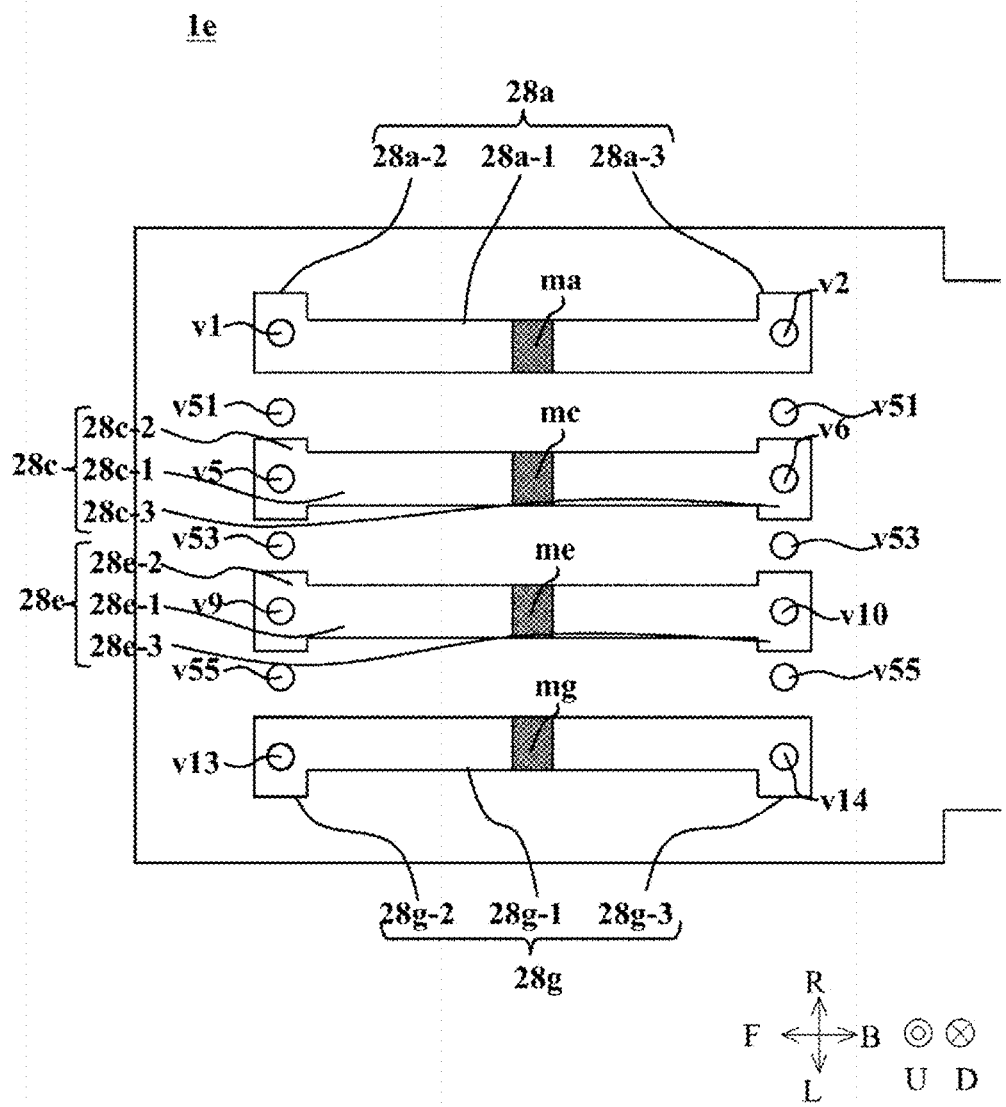
FIG. 10 is a top view of a left end portion of an insulator layer 16a of a circuit board 10f according to a preferred embodiment of the present invention.

A circuit board 10f according to a sixth modification of a preferred embodiment of the present invention will be described below with reference to the drawings. FIG. 10 is a top view of a left end portion of the insulator layer 16a of the circuit board 10f.

The circuit board 10f is different from the circuit board 10d in that the circuit board 10f does not include the signal electrodes 28b, 28d, 28f, and 28h. In this manner, the signal electrodes 28a, 28c, 28e, and 28g may be arranged in one row and do not need to be arranged in two rows.

Seventh Modification

Figure 11:
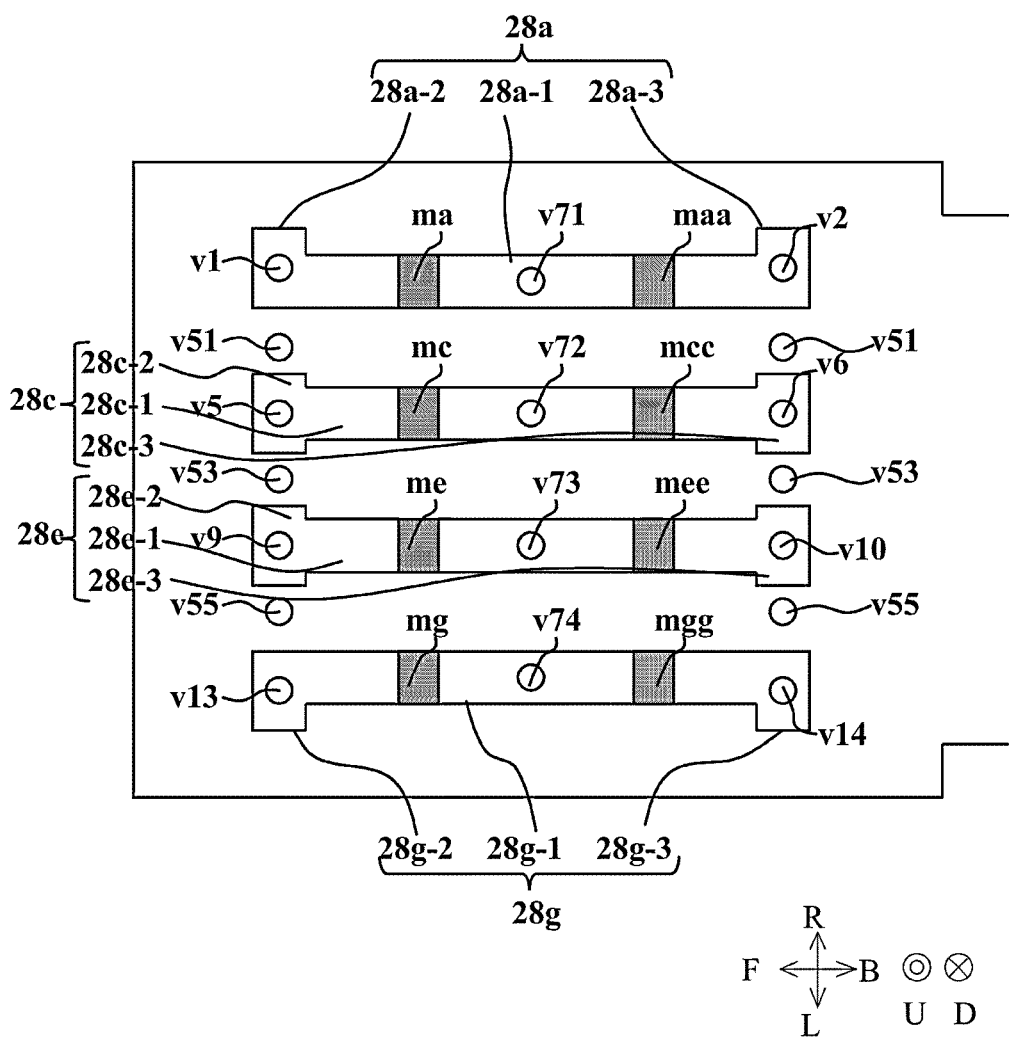
FIG. 11 is a top view of a left end portion of an insulator layer 16a of a circuit board 10g according to a preferred embodiment of the present invention.

A circuit board 10g according to a seventh modification of a preferred embodiment of the present invention will be described below with reference to the drawings. FIG. 11 is a top view of a left end portion of the insulator layer 16a of the circuit board 10g.

The circuit board 10g is different from the circuit board 10f in that the circuit board 10g further includes interlayer connection conductors v71 to v74 and plating layers maa, mcc, mee, and mgg. The interlayer connection conductors v71 to v74 are respectively connected to the center of the signal-electrode main bodies 28a-1, the center of the signal-electrode main bodies 28c-1, the center of a signal-electrode main body 28e-1, and the center of a signal-electrode main body 28g-1 in the longitudinal direction. The plating layers ma, mc, me, and mg are respectively provided between the interlayer connection conductors v1, v5, v9, and v13 and the interlayer connection conductors v71 to v74. The plating layers maa to mdd are respectively provided between the interlayer connection conductors v71 to v74 and the interlayer connection conductors v2, v6, v10, and v14. The rest of the structure of the circuit board 10g is the same as that of the circuit board 10f, and thus, the description thereof will be omitted.

Other Preferred Embodiments

The circuit board according to the present invention is not limited to the circuit boards 10 and 10a to 10g according to preferred embodiments of the present invention and modifications thereof, and changes can be made within the scope of the present invention. The configurations of the circuit boards 10 and 10a to 10g may be arbitrarily combined.

The electronic-component-equipped circuit board according to the present invention is not limited to the electronic-component-equipped circuit boards 1 and 1a to 1c according to preferred embodiments of the present invention and modifications thereof, and changes can be made within the scope of the present invention. The configurations of the electronic-component-equipped circuit boards 1 and 1a to 1c may be arbitrarily combined.

One or more interlayer connection conductors that electrically connect the first ground conductor layer 24 and the second ground conductor layer 26 to each other may be provided in the line region A3 each of the circuit boards 10 and 10a to 10g.

In each of the circuit boards 10 and 10a to 10g, the first ground conductor layer 24 and the second ground conductor layer 26 are not required components.

An electronic component other than the connector 100 may be mounted on the circuit boards 10 and 10a to 10g. The electronic component other than the connector 100 may be, for example, a chip electronic component, such as a capacitor or an inductor, an IC, or the like.

In each of the circuit boards 10 and 10a to 10g, the material of the protective layer 20 may be the same as the material of the insulator layers 16a to 16c.

In each of the circuit boards 10 and 10a to 10g, at least one signal conductor layer is provided.

In each of the circuit boards 10 and 10a to 10g, the conductive bonding members 60a to 60d, 62a to 62f, 64a to 64d, and 66a to 66f do not need to be made of solder. The conductive bonding members 60a to 60d, 62a to 62f, 64a to 64d, and 66a to 66f may be made of, for example, an electrically conductive adhesive.

In each of the circuit boards 10 and 10a to 10g, the plating layers ma to md and Ma to Mf and the conductive bonding members 60a to 60d, 62a to 62f, 64a to 64d, and 66a to 66f are not required components.

In each of the circuit boards 10 and 10a to 10g, the interlayer connection conductor v1 and the interlayer connection conductor v2 may be arranged at positions farther forward than the conductive bonding member 60a. Alternatively, the interlayer connection conductor v1 and the interlayer connection conductor v2 may be arranged at positions farther rearward than the conductive bonding member 60a.

In each of the circuit boards 10 and 10a to 10g, the interlayer connection conductor v1, the conductive bonding member 60a, and the interlayer connection conductor v2 do not need to be arranged in a line in this order from the front side to the rear side. For example, the interlayer connection conductor v1 may be located farther toward the left-hand side than the conductive bonding member 60a or may be located farther toward the right-hand side than the conductive bonding member 60a. The interlayer connection conductor v2 may be located farther toward the left-hand side than the conductive bonding member 60a or may be located farther toward the right-hand side than the conductive bonding member 60a.

In each of the circuit boards 10 and 10a to 10g, the protective layer 20 is not a required component. Thus, the signal conductor layers 22a to 22d, the ground electrodes 25a and 25b, and the signal electrodes 28a to 28d and 30a to 30d may be entirely or substantially entirely exposed from the circuit boards 10 and 10a to 10g. In other words, at least a portion of each of the signal conductor layers 22a to 22d, at least a portion of each of the ground electrodes 25a and 25b, and at least a portion of each of the signal electrodes 28a to 28d and 30a to 30d are exposed from the circuit boards 10 and 10a to 10g.

In each of the circuit boards 10 and 10a to 10g, the signal electrodes 28a to 28d and 30a to 30d may each have a uniform or substantially uniform width in the transverse direction.

In the circuit boards 10 and 10a to 10g, the thicknesses of the circuit boards 10 and 10a to 10g in the mounting region A1 in the vertical direction may respectively be equal to or smaller than the thicknesses of the circuit boards 10 and 10a to 10g in the line region A3 in the vertical direction.

In the circuit boards 10 and 10a to 10g, the widths of the circuit boards 10 and 10a to 10c in the mounting region A1 in the transverse direction may each be equal to or smaller than the width of each of the circuit boards 10 and 10a to 10g in the line region A3 in the direction orthogonal to the direction in which the signal conductor layers 22a to 22d extend.

In each of the circuit boards 10 and 10a to 10c, the ground electrodes 25a and 25b are not required components.

In each of the circuit boards 10 and 10a to 10g, the material of the insulator layers 16a to 16c does not need to include a thermoplastic resin. In addition, the multilayer body 12 does not need to have flexibility.

When viewed in the vertical direction, each of the circuit boards 10 and 10a to 10g extends in the longitudinal direction. However, each of the circuit boards 10 and 10a to 10g may be bent. Here, the phrase "each of the circuit boards 10 and 10a to 10g may be bent" refers to the case where each of the circuit boards 10 and 10a to 10g has a bent shape in a state where an external force is not applied thereto.

In each of the circuit boards 10 and 10a to 10g, the reinforcing members 50a and 50b are not required components.

The protective layer 20 may be, for example, a coverlay film.

Each of the signal electrodes 28a to 28d may be connected to two interlayer connection conductors. However, each of the signal electrodes 28a to 28d may be connected to a single interlayer connection conductor. Alternatively, each of the signal electrodes 28a to 28d may include portions to which two interlayer connection conductors are connected and may include another portion to which a single interlayer connection conductor is connected. For example, a signal conductor layer electrically connected to a signal electrode to which two interlayer connection conductors are connected is a power transmission line or an antenna line. A signal that consumes a large amount of power flows through, for example, a power line, an antenna line, such as an NFC antenna, or the like. As a result, the loss of a signal that consumes a large amount of power is reduced or prevented. A signal that consumes a small amount of power flows through a signal electrode to which a single interlayer connection conductor is connected. Thus, space can be saved. In addition, the signal conductor layers 22a and 22d can be provided not at an outer side portion but on an inner side portion.

The insulator layer 16a (the first insulator layer) does not need to be the insulator layer that is located at the highest position in the multilayer body 12. Thus, an insulator layer may be laminated on the insulator layer 16a. However, this insulator layer does not cover the signal electrodes 28a to 28d and 30a to 30d. In other words, a step may be provided in the multilayer body 12.

The plating layers Ma to Md may be provided at portions other than the exposed portions 125a to 125f of the ground electrode 25a.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a multilayer body including a plurality of insulator layers including a first insulator layer laminated in a vertical direction;
   a plurality of electrodes including a signal electrode and provided at an upper main surface of the first insulator layer so as to be arranged in a transverse direction, at least a portion of each of the plurality of electrodes being exposed to outside from the circuit board;
   a signal conductor layer provided at the multilayer body and located below the signal electrode; and
   a first interlayer connection conductor and a second interlayer connection conductor extending through the first insulator layer in the vertical direction and electrically connecting the signal electrode and the signal conductor layer to each other; wherein
   a plurality of mounting portions are located at the portions of the plurality of electrodes that are exposed to the outside from the circuit board;
   the first interlayer connection conductor and the second interlayer connection conductor are electrically connected to the signal electrode so as not to overlap one of the plurality of mounting portions located at the signal electrode when viewed in the vertical direction;
   the circuit board includes a mounting region including the plurality of electrodes and a line region connected to the mounting region and in which the signal conductor layer extends; and
   a width of the multilayer body in the mounting region in a direction orthogonal or substantially orthogonal to a direction in which the signal conductor layer extends is larger than a width of the multilayer body in the line region in the direction orthogonal or substantially orthogonal to the direction in which the signal conductor layer extends.

2. The circuit board according to claim 1, wherein
   the first interlayer connection conductor is connected to the signal electrode at a position farther forward in a rear side to a front side direction than the mounting portion that is provided at the signal electrode; and
   the second interlayer connection conductor is connected to the signal electrode at a position farther rearward in the rear side to the front side direction than the mounting portion that is provided at the signal electrode.

3. The circuit board according to claim 2, wherein the first interlayer connection conductor, the mounting portion provided at the signal electrode, and the second interlayer connection conductor are sequentially arranged in a line from the front side to the rear side.

4. The circuit board according to claim 1, wherein
   the plurality of insulator layers include a protective layer covering the plurality of electrodes;
   the protective layer includes an opening;
   at least a portion of the signal electrode is exposed to the outside from the circuit board through the opening;
   the plurality of mounting portions are located at the opening; and the first interlayer connection conductor and the second interlayer connection conductor overlap the protective layer when viewed in the vertical direction.

5. The circuit board according to claim 1, wherein a thickness of the circuit board in the mounting region in the vertical direction is larger than a thickness of the circuit board in the line region in the vertical direction.

6. The circuit board according to claim 5, further comprising a reinforcement structure fixed to a lower main surface of the multilayer body in the mounting region.

7. The circuit board according to claim 1, wherein the signal electrode includes:
a signal-electrode main body;
a signal-electrode first connecting portion; and
a signal-electrode second connecting portion; wherein
the mounting portions are located at the signal-electrode main body;
the first interlayer connection conductor is connected to the signal-electrode first connecting portion;
the second interlayer connection conductor is connected to the signal-electrode second connecting portion; and
a width of the signal-electrode first connecting portion in a direction orthogonal or substantially orthogonal to a direction in which the signal conductor layer extends and a width of the signal-electrode second connecting portion in the direction orthogonal or substantially orthogonal to the direction in which the signal conductor layer extends are each larger than a width of the signal-electrode main body in the direction orthogonal or substantially orthogonal to the direction in which the signal conductor layer extends.

8. The circuit board according to claim 1, further comprising a ground electrode surrounding the signal electrode when viewed in the vertical direction.

9. The circuit board according to claim 8, further comprising:
ground conductor layers provided at the insulator layers; and
one or more third interlayer connection conductors extending through the first insulator layer in the vertical direction and electrically connecting the ground electrode to the ground conductor layers; wherein
when viewed in a direction in which the first interlayer connection conductor and the second interlayer connection conductor are arranged and in a direction orthogonal or substantially orthogonal to the vertical direction, the one or more third interlayer connection conductors do not overlap either the first interlayer connection conductor or the second interlayer connection conductor.

10. The circuit board according to claim 1, further comprising:
connection conductor layers provided at the insulator layers; and
a fourth interlayer connection conductor extending through the insulator layers in the vertical direction and connecting the connection conductor layers to the signal conductor layer;
the first interlayer connection conductor and the second interlayer connection conductor are connected to the connection conductor layers; and
the fourth interlayer connection conductor does not overlap either the first interlayer connection conductor or the second interlayer connection conductor when viewed in the vertical direction.

11. The circuit board according to claim 1, wherein a material of the plurality of insulator layers includes a thermoplastic resin.

12. The circuit board according to claim 1, wherein the signal conductor layer is a power transmission line or an antenna line.

13. The circuit board according to claim 1, further comprising a plurality of conductive bonds each of which is provided at one of the plurality of mounting portions.

14. The circuit board according to claim 1, further comprising a plurality of plating layers each of which is provided at one of the plurality of electrodes.

15. An electronic-component-equipped circuit board comprising:
an electronic component; and
a circuit board; wherein
the electronic component includes:
at least one terminal; wherein
the circuit board includes:
a multilayer body including a plurality of insulator layers including a first insulator layer laminated in a vertical direction;
a signal electrode provided at an upper main surface of the first insulator layer and including a portion exposed to outside from the circuit board;
a signal conductor layer provided at the multilayer body and located below the signal electrode;
a first interlayer connection conductor and a second interlayer connection conductor extending through the first insulator layer in the vertical direction and electrically connect the signal electrode and the signal conductor layer to each other; and
a conductive bond; wherein
a mounting portion is located at the portion of the signal electrode that is exposed to the outside from the circuit board;
the first interlayer connection conductor and the second interlayer connection conductor are electrically connected to the signal electrode so as not to overlap the mounting portion, which is provided at the signal electrode when viewed in the vertical direction;
the conductive bond electrically connects the at least one terminal of the electronic component and the mounting portion to each other;
the circuit board includes a mounting region including the plurality of electrodes and a line region connected to the mounting region and in which the signal conductor layer extends; and
a width of the multilayer body in the mounting region in a direction orthogonal or substantially orthogonal to a direction in which the signal conductor layer extends is larger than a width of the multilayer body in the line region in the direction orthogonal or substantially orthogonal to the direction in which the signal conductor layer extends.

16. The electronic-component-equipped circuit board according to claim 15, wherein
the at least one terminal includes a plurality of terminals; and
the electronic component is a connector including the plurality of terminals.

17. The electronic-component-equipped circuit board according to claim 15, wherein a material of the plurality of insulator layers includes a thermoplastic resin.

18. The electronic-component-equipped circuit board according to claim 15, wherein the signal conductor layer is a power transmission line or an antenna line.

19. The electronic-component-equipped circuit board according to claim 15, further comprising a conductive bond provided at the mounting portion.

\* \* \* \* \*